(12) United States Patent
Yan et al.

(10) Patent No.: US 8,350,275 B2
(45) Date of Patent: Jan. 8, 2013

(54) OPTOELECTRONIC DEVICES AND COATINGS THEREFORE

(75) Inventors: Min Yan, Singapore (SG); James Edward Pickett, Schenectady, NY (US); Rebecca Suzanne Northey, Delmar, NY (US)

(73) Assignee: SABIC Innovative Plastics IP B.V. (NL)

( * ) Notice: Subject to any disclaimer, the term of this patent is extended or adjusted under 35 U.S.C. 154(b) by 19 days.

(21) Appl. No.: 13/078,180

(22) Filed: Apr. 1, 2011

(65) Prior Publication Data

US 2012/0248496 A1 Oct. 4, 2012

(51) Int. Cl.
*H01L 27/15* (2006.01)
*H01L 29/26* (2006.01)
*H01L 31/12* (2006.01)
*H01L 33/00* (2010.01)
*H01L 29/22* (2006.01)
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. ......... 257/79; 257/13; 257/94; 257/E31.11; 257/E33.055

(58) Field of Classification Search .............. 257/13, 257/79, 94, E31.11, E33.055
See application file for complete search history.

(56) References Cited

U.S. PATENT DOCUMENTS

| | | | |
|---|---|---|---|
| 3,444,129 A | 5/1969 | Young et al. | |
| 3,460,961 A | 8/1969 | Young et al. | |
| 3,492,261 A | 1/1970 | Young et al. | |
| 3,503,779 A | 3/1970 | Young et al. | |
| 4,994,318 A * | 2/1991 | Patel | 428/331 |
| 5,091,258 A * | 2/1992 | Moran | 428/437 |
| 5,338,370 A * | 8/1994 | Aoike | 136/258 |
| 5,391,795 A | 2/1995 | Pickett | |
| 5,426,131 A * | 6/1995 | Katsamberis | 522/16 |
| 5,474,620 A | 12/1995 | Nath et al. | |
| 5,529,654 A * | 6/1996 | Kavanagh et al. | 156/229 |

(Continued)

FOREIGN PATENT DOCUMENTS

CN 101506267 A 8/2009

(Continued)

OTHER PUBLICATIONS

Chinese Patent No. 101506267 (A); Publication Date: Aug. 12, 2009; Abstract Only; 1 Page.

(Continued)

*Primary Examiner* — Ida M Soward
(74) *Attorney, Agent, or Firm* — Cantor Colburn LLP (57) ABSTRACT

An optoelectronic device assembly can include: a coated element and an electroactive cell on the coated element, wherein the electroactive cell is selected from the group consisting of a light emitting diode and a photovoltaic cell. The coated element can include: transparent thermoplastic substrate and a protective weathering layer. The transparent thermoplastic substrate can include a material selected from the group consisting of aromatic polycarbonate and polyester, and combinations including at least one of the foregoing materials. The protective weathering layer can have a UV absorbance loss rate at 330 nm of less than or equal to 0.15 A/year as estimated from filtered xenon arc exposure and/or having a rate of erosion of less than or equal to 5 μm per year as estimated from filtered xenon arc exposure.

25 Claims, 2 Drawing Sheets

U.S. PATENT DOCUMENTS

| | | | |
|---|---|---|---|
| 5,633,049 A * | 5/1997 | Bilkadi et al. | 427/487 |
| 5,869,185 A | 2/1999 | Bahr et al. | |
| 5,958,598 A * | 9/1999 | Khudyakov et al. | 428/447 |
| 6,093,757 A * | 7/2000 | Pern | 524/99 |
| 6,172,296 B1 * | 1/2001 | Iwasaki et al. | 136/256 |
| 6,265,522 B1 | 7/2001 | Brunelle et al. | |
| 6,291,589 B1 | 9/2001 | Brunelle et al. | |
| 6,294,647 B1 | 9/2001 | Brunelle et al. | |
| 6,306,507 B1 | 10/2001 | Brunelle et al. | |
| 6,350,521 B1 | 2/2002 | Chen et al. | |
| 6,426,125 B1 | 7/2002 | Yang et al. | |
| 6,572,965 B1 | 6/2003 | McGee et al. | |
| 6,596,843 B2 | 7/2003 | Brunelle et al. | |
| 6,607,814 B2 | 8/2003 | Pickett et al. | |
| 6,610,409 B2 | 8/2003 | Pickett et al. | |
| 6,664,366 B2 | 12/2003 | Silva et al. | |
| 6,689,474 B2 | 2/2004 | Pickett et al. | |
| 6,861,482 B2 | 3/2005 | Brunelle et al. | |
| 6,875,499 B1 * | 4/2005 | De Toffol et al. | 428/212 |
| 7,015,640 B2 | 3/2006 | Schaepkens et al. | |
| 7,169,859 B2 | 1/2007 | Davis et al. | |
| RE40,508 E | 9/2008 | Brunelle et al. | |
| 7,605,221 B2 | 10/2009 | Davis et al. | |
| 7,635,792 B1 | 12/2009 | Cella et al. | |
| 7,790,292 B2 | 9/2010 | Colborn et al. | |
| 7,838,602 B2 | 11/2010 | Davis et al. | |
| 2003/0129409 A1 * | 7/2003 | Tacke-Willemsen et al. | 428/412 |
| 2004/0096666 A1 * | 5/2004 | Knox et al. | 428/412 |
| 2006/0001040 A1 | 1/2006 | Kim et al. | |
| 2006/0093786 A1 * | 5/2006 | Ohashi et al. | 428/131 |
| 2006/0227427 A1 * | 10/2006 | Dolgoff | 359/619 |
| 2007/0129492 A1 * | 6/2007 | Colborn et al. | 525/100 |
| 2007/0224464 A1 * | 9/2007 | Balasubramanian et al. | 429/13 |
| 2007/0225454 A1 | 9/2007 | Lewis et al. | |
| 2008/0000524 A1 * | 1/2008 | Deng | 136/255 |
| 2008/0138538 A1 | 6/2008 | Lewis et al. | |
| 2008/0138539 A1 | 6/2008 | Breitung et al. | |
| 2008/0138624 A1 | 6/2008 | Lewis et al. | |
| 2008/0295889 A1 * | 12/2008 | Schindler et al. | 136/263 |
| 2008/0299384 A1 | 12/2008 | Kim et al. | |
| 2009/0126778 A1 | 5/2009 | Brounne et al. | |
| 2009/0186440 A1 | 7/2009 | Duggal et al. | |
| 2009/0194166 A1 * | 8/2009 | Powell et al. | 136/260 |
| 2009/0286010 A1 | 11/2009 | Erlat et al. | |
| 2010/0032008 A1 * | 2/2010 | Adekore | 136/255 |
| 2010/0043875 A1 | 2/2010 | Bhaumik et al. | |
| 2010/0043878 A1 | 2/2010 | Bhaumik et al. | |
| 2010/0043879 A1 | 2/2010 | Bhaumik et al. | |
| 2010/0043880 A1 | 2/2010 | Bhaumik et al. | |
| 2010/0060833 A1 * | 3/2010 | Ochiai et al. | 349/117 |
| 2010/0119833 A1 * | 5/2010 | Madsen et al. | 428/413 |
| 2010/0270537 A1 | 10/2010 | Ye et al. | |
| 2011/0151218 A1 * | 6/2011 | Meyer Zu Berstenhorst et al. | 428/213 |
| 2011/0189812 A1 * | 8/2011 | Brabec et al. | 438/73 |
| 2012/0148835 A1 * | 6/2012 | Radkowski et al. | 428/336 |

FOREIGN PATENT DOCUMENTS

| | | |
|---|---|---|
| CN | 101528805 A | 9/2009 |
| DE | 60022039 T2 | 5/2006 |
| KR | 20090021194 A | 2/2009 |
| WO | 0061664 A1 | 10/2000 |
| WO | 0069945 A1 | 11/2000 |
| WO | 2008002757 A1 | 1/2008 |
| WO | 2008021673 A1 | 2/2008 |

OTHER PUBLICATIONS

Chinese Patent No. 101528805 (A); Publication Date: Sep. 9, 2009; Abstract Only; 1 Page.

South Korean Patent No. 20090021191 (A); Publication Date: Feb. 27, 2009; Abstract Only; 1 Page.

German Patent No. 60022039 (T2); Publication Date: May 24, 2006; Abstract Only; 1 Page.

ASTM G 155-00a; "Standard Practice for Operating Xenon Arc Light Apparatus for Exposure of Non-Metallic Materials"; Jan. 10, 2005; 8 Pages.

Cohen et al.; "Transparent Ultraviolet-Barrier Coatings"; Journal of Polymer Science: Part A-1; vol. 9; 1971; pp. 3263-3299.

U.S. Appl. No. 12/566,962, filed Sep. 25, 2009; "Protective Coating Compositions and Devices".

Pickett et al.; "Weathering Characteristics of Resorcinol Polyarylate Copolymers"; Polymer Preprints; vol. 48, Issue 1; 2007; pp. 643-644.

Pickett, J. E., "Highly Predictive Accelerated Weathering of Engineering Thermoplastics", Service Life Prediction: Callenging the Status Quo; Chapter 6; 2005; 9 Pages.

Pickett, J. E.; "UV Absorber Permanence and Coating Lifetimes"; Journal of Testing and Evaluation; vol. 32, No. 3; May 2004; pp. 240-245.

* cited by examiner

OPTOELECTRONIC DEVICES AND COATINGS THEREFORE

BACKGROUND

Disclosed herein are optically transparent, plastic, protective article assemblies, and specifically, optically transparent, weatherable, plastic that can protect optoelectronic devices, such as photovoltaic modules.

Photovoltaic (PV) modules have traditionally employed glass as a rigid superstrate, elastomeric encapsulation layers, and a polymeric backing sheet, making them relatively heavy and inflexible. More recently, flexible, lightweight modules have been made using thin film photovoltaic cells, such as amorphous silicon, and a transparent polymer film to allow light to enter and to protect the cell from the elements.

The transparent polymer film must meet a number of stringent requirements. It must have good transmission of light between the wavelengths of about 400 nm to about 1,200 nm and must protect the module components from physical damage and moisture. In particular, entry of liquid water into the module will inevitably cause corrosion and loss of performance. Cuts into the module can expose electrical components. Resistance toward cut damage is required by Underwriters Laboratories specification UL 1703 for Flat-Plate Photovoltaic Modules and Panels, for example. It is therefore essential that the polymer film covering the module be sufficiently tough toward physical damage. In addition, the film must retain its properties for long periods in use. Typically, lifetimes of twenty years or more are expected for photovoltaic modules. Few kinds of polymers have both adequate physical properties and sufficient resistance toward outdoor weathering under the high temperatures and full sun conditions of a photovoltaic module.

The current art employs a fluorocarbon polymer such as poly(ethylene-co-tetrafluoroethylene) (ETFE) available commercially as Tefzel* film from DuPont. Fluorocarbon polymers are extremely resistant toward weathering, and can easily endure twenty or more years in this application. However, fluorocarbon polymers are both relatively soft and relatively expensive. As a result, it is difficult to construct a module that has both low cost and has sufficient film thickness to avoid cut or puncture damage. One solution has been the introduction of glass fibers into the encapsulant layers to improve the cut resistance of a module based on an ETFE. While the glass fibers can protect against cuts deep enough to expose the electrical components and thereby pass the UL1703 standard, it is not clear that the integrity of the envelope toward water penetration is retained. Since these modules can be deployed directly on flat or angled roofs, damage is likely over the lifetime of the module.

Some photovoltaic cells require protection not just from liquid water but also from water vapor. Efficient cells can be made using cadmium telluride (CdTe) or from copper indium gallium selenide (CIGS), for example. However, these cells rapidly lose efficiency when exposed to water vapor. Since optoelectronic devices for outdoor applications, such as solar cells, currently carry a 20-25 year guarantee for outdoor use, these devices are protected from moisture, oxygen, and hail, with glass, which protects while at the same time still allowing solar spectrum to enter the device. Glass, however, is more rigid, brittle, and heavy.

Thus, there is a need for light weight (compared to glass) optoelectronic devices that are highly weatherable, tough, puncture resistant, and/or water vapor resistant.

SUMMARY

Disclosed, in various embodiments, are optoelectronic devices and coatings therefore, and methods for making and using the same.

An optoelectronic device assembly can comprise: a coated element and an electroactive cell on the coated element, wherein the electroactive cell is selected from the group consisting of a light emitting diode and a photovoltaic cell. The coated element can comprise: transparent thermoplastic substrate and a protective weathering layer. The transparent thermoplastic substrate can comprise a material selected from the group consisting of aromatic polycarbonate and polyester, and combinations comprising at least one of the foregoing materials. The protective weathering layer can have a UV absorbance loss rate at 330 nm of less than or equal to 0.15 A/year as estimated from filtered xenon arc exposure and/or having a rate of erosion of less than or equal to 5 μm per year as estimated from filtered xenon arc exposure.

These and other features and characteristics are more particularly described below.

BRIEF DESCRIPTION OF THE DRAWINGS

The following is a brief description of the drawings wherein like elements are numbered alike and which are presented for the purposes of illustrating the exemplary embodiments disclosed herein and not for the purposes of limiting the same.

DETAILED DESCRIPTION

Optoelectronic devices such as solar cells are particularly difficult to protect with a polymer material due to the very harsh conditions in which they operate and the fact that their expected life is greater than or equal to 20 years (e.g., manufacturer 20 year guarantee). The modules are used outdoors, particularly in areas of high heat and sun. As a result, they are exposed to particularly harsh ultraviolet radiation (UV) and thermal conditions. The thermal conditions are further exasperated by the fact that the modules are a dark color, e.g., black, which further enhances their thermal absorption. Attempts to utilize various polymer materials have failed, including those considered to be "weatherable". Generally, polymer films and sheets were considered weatherable if they could withstand greater than three years of weathering exposed at a south-facing 45° angle at a Miami, Fla. or Phoenix, Ariz. test site. However, these materials do not have the extreme weatherability capability needed in the photovoltaic modules where the materials need to withstand more than 20 years of exposure under the conditions of full sun and high temperature (hereinafter referred to as extreme weatherability). It was discovered that even many UV protective materials (e.g., coated on a polymer such as polycarbonate) failed to protect the polymer under the present conditions of extreme weatherability. As a result, artisans do not consider engineering thermoplastics as an option for electroactive devices (e.g., photovoltaic cells, light emitting diodes (LED) (including organic light emitting diodes (OLED)), and so forth) that require extreme weatherability.

Unless specified otherwise, the extreme weatherability discussed herein is measured in a xenon arc accelerated weathering chamber such as a Ci5000 Weather-ometer (a product of Atlas Material Testing Technology, LLC) using lamp filters to give a good match to natural solar radiation. The filters can be a combination of quartz and infrared (IR)-reflecting sodalime glass (CIRA-sodalime) or the combination of RightLight* and CIRA-quartz. The CIRA and RightLight* filters are commercially available from Atlas Material Testing Technology, LLC, Chicago, Ill. The correlation between these conditions and one year outdoor weathering in Miami, Fla. is estimated to be approximately 3 megajoules per square meter ($MJ/m^2$) measured at 340 nm in Service Life Prediction: Challenging the Status Quo, J. W. Martin, R. A. Ryntz, and R. A. Dickie, Eds., Federation of Societies for Coatings Technology, 2005, pp 93-106.

As noted above, besides glass, poly(ethylene-co-tetrafluoroethylene) (ETFE) has been employed in optoelectronic devices, but this material has problems such as insufficient mechanical strength (e.g., the material is relatively soft and not puncture resistant). Tougher and less expensive transparent polymers than poly(ethylene-co-tetrafluoroethylene) (ETFE) include aromatic polycarbonates (PC) (e.g., polycarbonate of bisphenol A (BPA)) and poly(ethylene terephthalate) (PET). These polymers can be used at much greater thickness at the same or lower cost than fluoropolymers. Hence, forming an assembly comprising these polymers can reduce cost while enhancing structural integrity. However, these polymers are inherently unstable toward weathering, e.g., these polymers are known to have problems of long term color instability under ultraviolet radiation conditions, resulting in yellowing of the polymer. The yellowing can detract from the polymer's transparency and attractiveness. Loss of gloss and embrittlement can also be undesirable long term phenomena in polymers. A further disadvantage of polymers compared to glass is their lack of hermeticity. Polymeric film typically has moisture diffusion rate of 1 to 10 grams per square meter per day ($g/m^2/day$) range, which is several orders of magnitude higher than that required to protect some optoelectronic devices.

Figure 4:
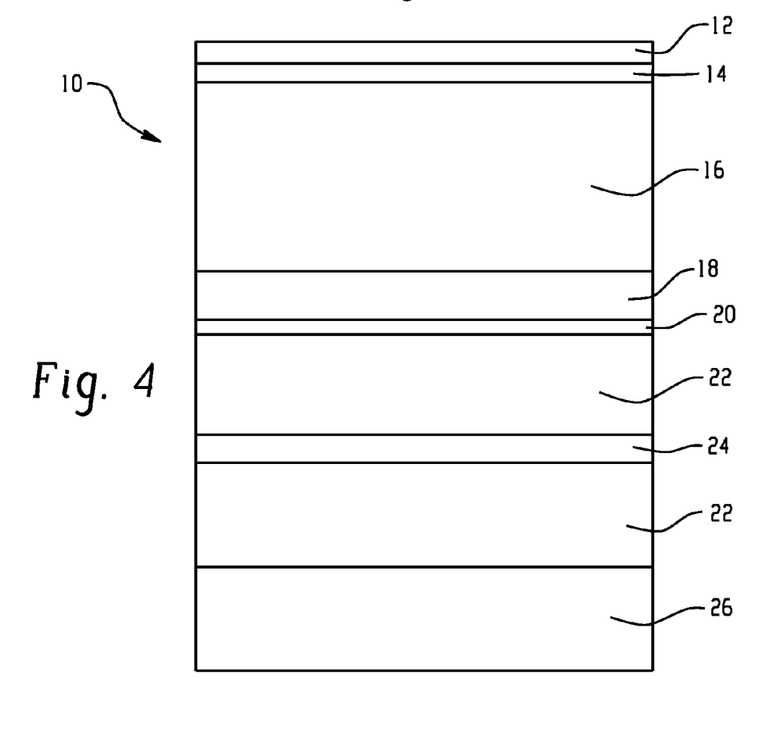
FIG. 4 is a cross-sectional, schematic representation of an exemplary assembly.

The optically transparent, weatherable, plastic assembly disclosed herein can protect optoelectronic devices, such as solar cells, in outdoor working environments for periods of greater than or equal to 20 years under extreme weathering conditions and while maintaining high mechanical toughness, in particular, high resistance to puncture and cutting. The assembly is optically transparent and has extreme weatherability, is optionally hermetic, and has a surface toughness to withstand mechanical damage when subjected to a load of greater than 3 pounds as measured by the test specified by UL 1703 Section 24. The assembly comprises a thermoplastic substrate that is mechanically tough and stable in extreme weather conditions. The assembly 10 can comprise: a highly weatherable outer layer (possessing extreme weatherability); gas diffusion barrier coating(s) (e.g., that can reduce permeation of moisture and other gases); a planarization coating(s) (e.g., to smooth the substrate surface); adhesion promotion coating(s) (e.g., to enhance adhesion between elements of assembly); and/or stress balance coating(s) (e.g., to maintain the assembly's geometry (e.g., flat or at certain curvature). The interface between adjacent individual elements of article assembly can be discrete or can have compositional gradient (e.g., the composition can be continuously changing over the interface). An example of the assembly is shown in FIG. 4.

The thermoplastic substrate comprises a polymer that is mechanically tough. Possible materials include bisphenol-A polycarbonate, other aromatic polycarbonates, and polyesters (e.g., poly(ethylene terephthalate) (PET)), as well as combinations comprising at least one of the foregoing materials. The substrate should be transparent (e.g., having a transparency of greater than or equal to 80% as determined using ASTM D1003-00, procedure B using CIE standard illuminant C at wavelengths of 420 nanometers (nm) to 1,200 nm). The substrate can also be of sufficient thickness to prevent mechanical damage of the module; e.g., a combined substrate and weathering layer thickness of greater than or equal to 3 mils (76.2 micrometers (μm)), specifically, greater than or equal to 5 mils (127 μm) thick, including any protective weathering layers.

Weathering stability of tough, aromatic polymers presents a particular challenge. A number of methods are known for imparting weatherability, but currently none is known that will give protection for the desired 20 or more years of service life in a photovoltaic application. The design of the weatherable system must be carefully considered to balance performance and practicality.

The thermoplastic substrate is ultraviolet radiation (UV) protected by: (i) a coating comprising a stable matrix material (also referred to as an extremely weatherable outer layer) and UV absorbers having loss rates of less than or equal to 0.15 absorbance units per year as estimated by xenon arc exposure using the method described in Journal of Testing and Evaluation, 32, 240-245 (2004); and/or (ii) a layer (e.g., co-extruded or laminated) comprising a polymer containing ultraviolet absorber(s) such that the rate of erosion is less than or equal to 4 micrometers per year (μm/yr) of exposure as estimated by xenon arc accelerated weathering; and/or (iii) a layer (co-extruded or laminated) comprising a self-protecting polymer such as resorcinol polyarylate having a rate of erosion less than or equal to 4 micrometers per year of exposure as estimated by xenon arc accelerated weathering.

The extremely weatherable outer layer (e.g., coating), which can be applied to the substrate, can comprise a stable coating matrix and stable UV absorber(s). Examples of stable coating matrices are silicones, poly(meth)acrylates, and combinations comprising at least one of the foregoing. Possible UV absorbers include triazines and/or dibenzoylresorcinols. Triazines include:

wherein $R_1$=H, $R_2$, $R_3$=independently H, aliphatic $C_1$-$C_{12}$, cycloaliphatic $C_3$-$C_{12}$, or aromatic, $R_4$=H, $C_1$-$C_{24}$ aliphatic, $C_3$-$C_{24}$ cycloaliphatic. Aliphatic and cycloaliphatic groups can also contain alcohol, ether, ester, and carboxylic acid functionality. They can also be linear or branched and may contain silicon. Desirably, $R_1$, $R_2$, and $R_3$=H. Specific examples are $R_1$, $R_2$, $R_3$=H, $R_4$=$C_6H_{13}$ (e.g., Tinuvin® 1577) and $R_1$, $R_2$, $R_3$=H, $R_4$=$CH_2CH_2OOCCH(C_2H_5)$ $CH_2CH_2CH_2CH_3$ (e.g., LA-46).

Possible dibenzoylresorcinols include:

wherein: $R_5$=H, aliphatic $C_1$-$C_{12}$, cycloaliphatic $C_3$-$C_{12}$, $CH_2CH_2CH_2SiR_n(OR_8)_{3-n}$, n=0-2, $R_8$=H, aliphatic $C_1$-$C_{12}$; $R_6$, $R_7$=independently H, aliphatic $C_1$-$C_{12}$, cycloaliphatic $C_3$-$C_{12}$, or aromatic.

Another possible UV absorber is dibenzoylresorcinol:

where $R_9$, $R_{10}$, $R_{11}$, $R_{12}$ are independently H, aliphatic $C_1$-$C_{12}$, cycloaliphatic $C_3$-$C_{12}$, or aromatic.

Some specific examples of stable UV absorbers are 4,6-dibenzoylresorcinol, silylated 4,6-dibenzoylresorcinols such as described in U.S. Pat. Nos. 5,391,795 and 5,679,820, and 2,4-diphenyl-6-(2'-hydroxy-4'alkoxyphenyl)-1,3,5-triazines (such as Tinuvin* 1577 commercially available from BASF and ADK STAB LA-46 commercially available from Asahi Denka). A stable UV absorber is characterized by a loss rate of less than 0.15 absorbance units at 330 nm per year of extreme weathering as estimated by exposure to 3 $MJ/m^2$ (measured at 340 nm) of filtered xenon arc accelerated weathering. Mixtures of UV absorbers can be used to improve compatibility. When used in a coating, the UV absorber(s) are present in an amount of greater than or equal to 10 weight percent (wt %), specifically, greater than or equal to 15 wt %, based upon a total weight of the coating. The thickness of the coating is sufficient to have an initial absorbance at 330 nm of greater than or equal to 3 absorbance units, specifically, greater than or equal to 4, e.g., to accommodate the expected loss of absorbance during weathering. When used in a co-extruded or laminated layer, the UV absorber(s) are present in an amount greater than or equal to 7 wt %, specifically, 8 wt % to 12 wt %, based upon the total weight of the layer.

The layer of substrate polymer containing one or more UV absorbers can be co-extruded or laminated onto the substrate. The UV absorber has a loss rate less than 0.15 absorbance units per year resulting in an estimated erosion rate of less than 4 micrometers per year as measured by xenon arc accelerated weathering. Exemplary UV absorbers are 2,4-diphenyl-6-(2'-hydroxy-4'alkoxyphenyl)-1,3,5-triazines (such as Tinuvin* 1577 commercially available from BASF Corporation, Florham Park, N.J. 07932 and ADK STAB LA-46 commercially available from Adeka Corporation, Tokyo, Japan), resorcinols (such as 4,6-dibenzoylresorcinols and/or coupled 4,6-dibenzoylresorcinols as described in U.S. Pat. No. 5,763,674), as well as combinations comprising at least one of the foregoing. The UV absorbers can be present in an amount of greater than or equal to 5 wt %, specifically greater than or equal to 7 wt %, and even more specifically greater than or equal to 8 wt %. This layer can be greater than or equal to 2 mils (50.8 μm) thick, specifically greater than or equal to 3 mils (76.2 μm) thick.

The extremely weatherable outer layer (e.g., self-protecting polymer layer) can comprise the resorcinol polyarylate, which can be a polyester derived from resorcinol and a mixture of isophthalic and terephthalic acids. For example, the polyarylate can be a 1,3-dihydroxybenzene isophthalate/terephthalate comprising structural units of the formula:

(II)

wherein each $R^1$ is a substituent, especially halo or $C_{1-12}$ alkyl, and p is 0-3, optionally in combination with structural units of the formula (III)

wherein $R^1$ and p are as previously defined and $R^2$ is a divalent $C_{4-12}$ aliphatic, alicyclic or mixed aliphatic-alicyclic radical.

Optionally, other acid groups, such as those derived from aliphatic dicarboxylic acids such as succinic acid, adipic acid or cyclohexane-1,4-dicarboxylic acid, or from other aromatic dicarboxylic acids such as 1,8-naphthalenedicarboxylic acid, can be present in the coating layer. These can be present in amounts no greater than or equal to 30 mole percent. It is possible to include other polyesters which are miscible in at least some proportions with the polyarylate, such polymers are exemplified by PBT, PET, PTT, and PCCD. The coating layer polymer can consist of units of formula II, optionally in combination with units of formula III.

The units of formula II contain a resorcinol or substituted resorcinol moiety in which any $R^1$ groups can be $C_{1-4}$ alkyl; i.e., methyl, ethyl, propyl or butyl. In one embodiment $R^1$ groups are primary or secondary groups. In a particular embodiment $R^1$ groups are methyl. In some embodiments p is zero, although moieties in which p is 1 are possible. Said resorcinol moieties are most often bound to isophthalate and/or terephthalate moieties.

In the optional soft block units of formula III, resorcinol or substituted resorcinol moieties are again present in ester-forming combination with $R^2$ which is a divalent $C_{4-12}$ aliphatic, alicyclic or mixed aliphatic-alicyclic radical. In some embodiments $R^2$ is aliphatic and especially $C_{8-12}$ straight chain aliphatic.

The resorcinol polyarylate can be a block copolymer with BPA polycarbonate comprising the other blocks as described in U.S. Pat. Nos. 6,559,270, 6,572,956, 6,607,814, and 6,610,409. An example of a resorcinol polyarylate is Lexan* SLX (commercially available from SABIC Innovative Plastics, Pittsfield, Mass.). In the case of the block copolymers, the resorcinol polyarylate content can be greater than or equal to 50 wt %, specifically, greater than or equal to 80 wt %, with the remainder being blocks of bisphenol A polycarbonate. The layer of resorcinol polyarylate can be applied, for example, by co-extrusion, coating, or lamination. Tie-layer(s), e.g., of other materials such as aliphatic polyurethane and/or poly(ethylene-co-vinyl acetate), can be used between the resorcinol polyarylate and the substrate to improve adhesion. The layer of resorcinol polyarylate can be greater than or equal to 2 mils (50.8 μm) thick, specifically, greater than or equal to 3 mils (76.2 μm) thick, e.g., to accommodate the erosion expected during weathering.

Optionally, the article can comprise planarizing layer(s) and/or organic-inorganic composition barrier coating layer(s). The barrier coating (which can be graded or non-graded) can comprise at least one zone substantially organic in composition and at least one zone substantially inorganic in composition. Some exemplary organic-inorganic composition barrier coatings are described in reference U.S. Pat. No. 7,449,246. Exemplary coating compositions for the organic-inorganic barrier layer, are organic, ceramic and/or inorganic materials, as well as combinations comprising at least one of the foregoing. These materials can be reaction or recombination products of reacting plasma species and are deposited onto the substrate surface. Organic coating materials typically comprise carbon, hydrogen, oxygen, and optionally other elements, such as sulfur, nitrogen, silicon, etc., depending on the types of reactants. Exemplary reactants that result in organic compositions in the coating are straight or branched alkanes, alkenes, alkynes, alcohols, aldehydes, ethers, alkylene oxides, aromatics, silicones, etc., having up to 15 carbon atoms. Inorganic and ceramic coating materials typically comprise oxide; nitride; carbide; boride; or combinations comprising at least one of the foregoing of elements of Groups IIA, IIIA, IVA, VA, VIA, VIIA, IB, and IIB; metals of Groups IIIB, IVB, and VB; and rare-earth metals. For example, the barrier coating can have optical properties that are substantially uniform along an axis of light transmission, said axis oriented substantially perpendicular to the surface of the coating.

For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired coating composition. A graded composition of the coating is obtained by changing the compositions of the reactants fed into the reactor chamber during the deposition of reaction products to form the coating.

The barrier coating can have a transmission rate of oxygen through the barrier coating of less than or equal to 0.1 cubic centimeters per square meter-day ($cm^3/(m^2$ day)), as measured at 25° C. with a gas containing 21 vol % oxygen. The water vapor transmission can be less than about 0.01 grams per square meter-day ($g/(m^2$ day)), as measured at 25° C. and with a gas having 100% relative humidity.

Barrier layer(s) can be applied to polymer films by various methods such as chemical vapor deposition (e.g., plasma-enhanced chemical-vapor deposition, radio-frequency plasma-enhanced chemical-vapor deposition, expanding thermal-plasma chemical-vapor deposition, electron-cyclotron-resonance plasma-enhanced chemical-vapor deposition, and inductively-coupled plasma-enhanced chemical-vapor deposition), sputtering (e.g., reactive sputtering), and so forth, as well as combinations comprising at least one of the foregoing. Some such methods are described in U.S. Pat. No. 7,015,640 and US Patent Publication No. 2006/0 001040.

The planarizing layer can comprise a resin such as an epoxy based resin (cycloaliphatic resin), an acrylic based resin, a silicone resin, as well as combinations comprising at least one of the foregoing. One example of a planarizing layer is a UV-cured acrylic-colloidal silica coating such as the Lexan* HP-H UV-cured acrylic-colloidal silica coating commercially available from the Specialty Film and Sheet business unit of SABIC Innovative Plastics. The planarizing layer, and/or other coatings, can further include additive(s) such as flexibilizing agent(s), adhesion promoter(s), surfactant(s), catalyst(s), as well as combinations comprising at least one of the foregoing. In some embodiments, the planarizing layer thickness can be 1 nanometer (nm) to 100 micrometers (μm). Often the planarizing layer thickness can be 100 nm to 10 μm, specifically, 500 nm to 5 μm.

The planarizing layer can be substantially smooth and substantially defect free. The term "average surface roughness" $R_a$ is defined as the integral of the absolute value of the roughness profile measured over an evaluation length. The term "peak surface roughness" $R_p$ is the height of the highest peak in the roughness profile over the evaluation length. The term "substantially smooth" means the average surface roughness $R_a$ is less than or equal to 4 nm, specifically, less than or equal to 2 nm, and more specifically, less than or equal to 0.75 nm. The peak surface roughness $R_p$ can be less than or equal to 10 nm, specifically less than or equal to 7 nm, and more specifically, less than or equal to 5.5 nm. Substantially defect free means the number of point defects is less than or equal to 100 per square millimeter ($mm^2$), specifically, less than or equal to $10/mm^2$, and more specifically, $1/mm^2$.

The coated substrate can have a low permeability of oxygen, water vapor and other reactive materials present in the environment. By low permeability it is meant that the oxygen permeability is less than or equal to 0.1 $cm^3/(m^2$ day), as measured at 25° C., and with a gas containing 21 volume-percent (vol %) oxygen. The water vapor transmission rate can be less than or equal to $1 \times 10^{-2}$ grams per square meter day ($g/(m^2$ day)), as measured at 25° C. with a gas having 100% relative humidity. The coated substrate can have an average light transmittance greater than or equal to 85% in a wavelength range of 420 nanometers to 700 nanometers.

Often, a planarizing and/or adhesion promoting layer is applied to one side of the substrate before application of the barrier layer(s).

The coated substrate can be employed to protect an optoelectronic device, such as a photovoltaic (PV) cell. Examples of PV cells are single crystal silicon, polycrystalline silicon, amorphous silicon, silicon tandem cells, copper indium gallium selenide (CIGS), cadmium telluride (CdTe), and organic cells, as well as combinations comprising at least one of the foregoing. The various types of cells have different demands for moisture protection varying from protection against only liquid water to highly effective protection from water vapor making the moisture barrier optional. Some PV cells can be applied to relatively thin, flexible substrates, such as stainless steel foil or polymer films.

Typically, a PV module comprises a glazing layer, an encapsulant, the interconnected PV cells, another layer of the same or a different encapsulant, and a backing material. The encapsulants are often curable materials such as poly(ethylene vinyl acetate) (EVA), silicones, thermoplastic materials (such as aliphatic polyurethanes and/or polyolefin ionomers), and combinations comprising at least one of the foregoing. They are selected on the basis of clarity, adhesion, and mechanical protection provided to the PV cell. The backing material is selected according to the application. For example, flexible PV modules can use a polymer film backing while crystalline silicon cells can use a rigid backing. The essential criterion is that the backing has good adhesion to the selected encapsulant.

As is illustrated in FIG. 4, the assembly can comprise an adhesive layer (encapsulant) 22 on one or both sides of the optoelectronic device 24. For example, the adhesive layer(s) 22 can be in physical contact with the optoelectronic device 24. The weathering layer 12 can be located on one side of the optoelectronic device 24, on the side to be directly exposed to the weathering conditions. This weathering layer 12 can be the outermost layer (e.g., not covered by another layer). Between the weathering layer 12 and the optoelectronic device 24 is the substrate 16. Between the substrate 16 and the optoelectronic device 24 can be optional leveling layer(s) 18, optional oxygen/moisture barrier layer(s) 20, and optionally the adhesive layer 22. Between the weathering layer 12 and the substrate 16 can be primer layer(s) 14. On the side of the optoelectronic device 24 that is opposite the weathering layer 12 is a backing sheet 26 with an optional adhesive layer 22 between the backing sheet 26 and the optoelectronic device 24.

A photovoltaic cell can be formed of layers of p-i-n semiconductive material. Optionally, each layer of which can, in turn, be formed of, a semiconductor alloy material (e.g., a thin film of such alloy material).

In one embodiment, a p-i-n type photovoltaic device, such as a solar cell, can comprise individual p-i-n type cells. Below the lowermost cell can be a substrate (e.g., a transparent substrate) or a substrate comprising a metallic material such as stainless steel, aluminum, tantalum, molybdenum, chrome, or metallic particles embedded within an insulator (cermets). In some applications there is a thin oxide layer and/or a series of base contacts prior to the deposition of the amorphous semiconductor alloy material.

Each of the cells can be fabricated from a body of thin film semiconductor alloy material comprising silicon and hydrogen. Each of the bodies of semiconductor alloy material includes an n-type layer of semiconductor alloy material; a substantially intrinsic layer of semiconductor alloy material; and a p-type layer of semiconductor alloy material. The intrinsic layer can include traces of n-type or p-type dopant material without forfeiting its characteristic neutrality, hence it may be referred to as a "substantially intrinsic layer".

Also, although p-i-n type photovoltaic cells are depicted, the methods and materials can also be used to produce single or multiple n-i-p type solar cells, p-n type cells or devices, Schottky barrier devices, as well as other semiconductor elements and/or devices such as diodes, memory arrays, photoresistors, photodetectors, transistors, etc. The term "p-i-n type", as used herein, is defined to include any aggregation of n, i, and p layers operatively disposed to provide a photoresponsive region for generating charge carriers in response to absorption of photons of incident radiation.

The following examples are merely illustrative of the device disclosed herein and are not intended to limit the scope hereof.

EXAMPLES

Example 1

Puncture Resistance Comparisons

Figure 1:
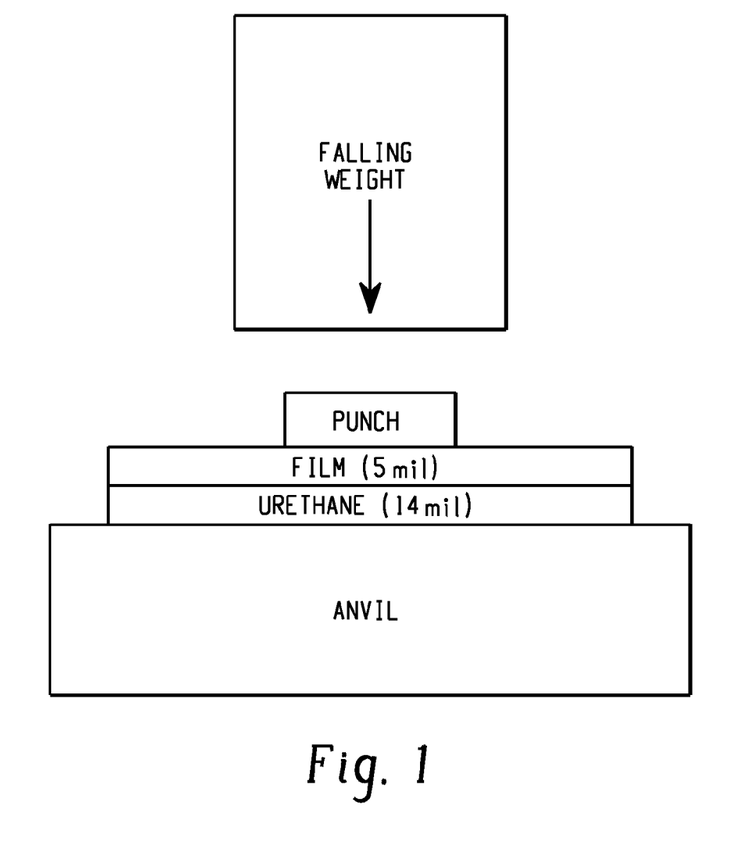
FIG. 1 is a schematic representation of a puncture test.

One measure of puncture resistance is supporting the polymer film on an encapsulant film and impacting with a punch as shown in FIG. 1. Thus, a 4 pound (1.8 kg) weight was dropped from various heights onto a flat, 0.19 inch (0.48 cm) square steel punch Failure is defined as a break in the polymer film. Films of 5 mil (127 µm) thickness were supported on a polyurethane encapsulant film 14 mils (355.6 µm) thick supplied by Stevens Urethane. The forces were applied to films of an ETFE polymer (commercially available from 3M Company), a PC film (Lexan* 8050 film, commercially available from SABIC Innovative Plastics IP B.V.), and a PET film (commercially available from DuPont-Teijen) are shown in Table 1. The results show that PC and PET can withstand greater penetrating forces than ETFE at equivalent thicknesses.

TABLE 1

| Force inch-lb | Penetration | | |
|---|---|---|---|
| (kg-cm) | ETFE | PC | PET |
| 20 (23) | pass | pass | pass |
| 40 (46) | pass | pass | pass |
| 60 (69) | pass | pass | pass |
| 80 (92) | fail | pass | pass |

Example 2

Cut Test Results

Figure 2:
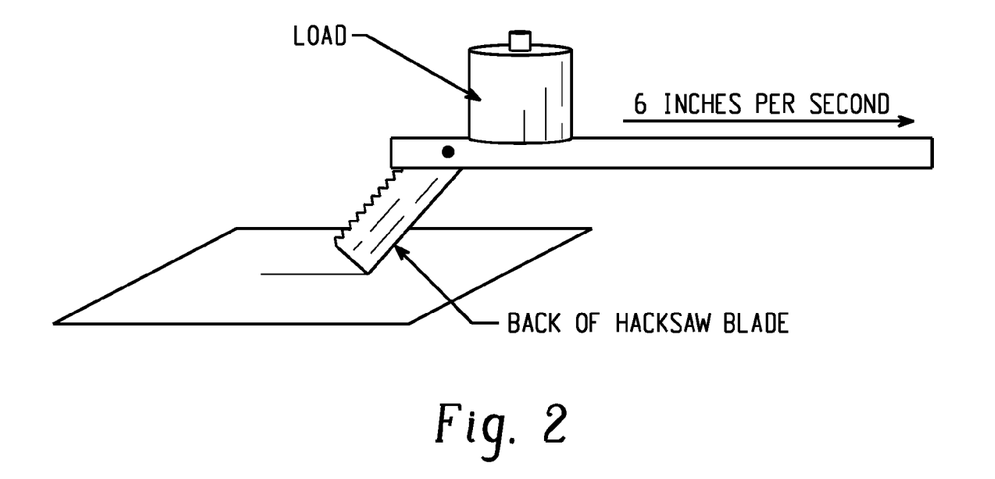
FIG. 2 is a schematic representation of a cut test.

A measure of cut resistance is provided by Underwriters Laboratories UL1703 section 24 in which a weighted carbon steel blade is drawn across the polymer film as is shown schematically in FIG. 2. The load is measured at the blade tip. Films were vacuum laminated to poly(ethylene-co-vinyl acetate) (EVA) or polyurethane encapsulant films to simulate modules. For comparison, a portion of a flexible Uni-Solar Photovoltaic Laminate was also tested. To determine whether the film was cut through, a solution of 1 milligram (mg) of fluorescein dye in 1 milliliter (mL) of 95% ethanol was applied to the area and allowed to dry. Excess fluorescein was removed by running water and the area was examined under a 365 nanometers (nm) blacklight. Any penetration of the solution through the film resulted in fluorescein diffusing into the encapsulant resulting in intensely fluorescent zones. Results are shown in Table 2.

TABLE 2

| Sample | load (pounds) | | | | |
|---|---|---|---|---|---|
| | 2 | 3 | 4 | 5 | 6 |
| Unisolar module (2 mil (50.8 μm) ETFE/EVA-glass) | OK | cut | | | |
| 5 mil (127 μm) ETFE/EVA encapsulant | OK | OK | OK | cut | |
| 2.5 mil (63.5 μm) PC/EVA encapsulant | OK | OK | cut | | |
| 5 mil (127 μm) PC/polyurethane encapsulant | OK | OK | OK | OK | cut |
| 12 mil (304.8 μm) co-extruded PC film/polyurethane encapsulant | OK | OK | OK | OK | OK |

A commercially-available flexible amorphous silicon module from Uni-Solar, consisting of approximately 2 mil (50.8 μm) ETFE and glass-filled EVA encapsulant as described in U.S. Pat. No. 5,474,620 showed cut-through with a 3-pound (1.4 kg) load. PC of similar thickness with an unfilled encapsulant showed cut-through with a 4-pound (1.8 kg) load. ETFE at 5 mils (127 μm) with an unfilled encapsulant cut through at 5-pounds (2.3 kg) while 5 mil (127 μm) PC cut through at 6 pounds (2.7 kg). Thicker 8 mil (200 μm) PC with a 4 mil (100 μm) co-extruded protective weatherable layer showed no cut-through even with a 6 pound (2.7 kilogram (kg)) load. This example shows that PC films are more resistant to cutting than ETFE.

Example 3

UV Stability

Several methods exist to improve the weathering resistance of polymers such as PC and PET. For example, coatings containing ultraviolet absorbing agents (UVA) can be applied. However, it is difficult to achieve the desired greater than 20 years weathering because the UVA itself is susceptible to photodegradation. The lifetime of a transparent coating ultimately is determined by the lifetime of the UV absorber and the stability of the matrix. One is often limited by the maximum thickness and maximum UVA loading allowed for the coating before physical properties are compromised.

The rates of UV absorber loss are determined in the coating of interest because the rates often are dependent on the matrix. The coatings are exposed to filtered xenon arc weathering using daylight filters as defined in ASTM G-155. Loss rates of representative UV absorbers in PMMA are shown in Table 3 by the method described in *Journal of Testing and Evaluation*, 32(3), 240-245 (2004). It has been found that loss rate varies considerably even among absorbers of the same general class. Coatings containing triazines with no methyl groups on the aromatic rings, and benzophenones bearing the 4,6-dibenzoylresorcinol moiety, are particularly desirable, as well as combinations comprising at least one of the foregoing. Exemplary triazines include Tinuvin* 1577 (commercially available from BASF) and LA-46 (commercially available from Adeka Corporation).

Desirably, UV absorber has a loss rate of less than 0.1 A/MJ/m$^2$, specifically, less than or equal to 0.05 A/MJ/m$^2$, as measured at 340 nm of filtered xenon arc exposure. With a correlation of approximately 3 MJ/m$^2$ being equivalent to one year of extreme weathering, this would give a loss rate less than or equal to 0.15 A/year.

TABLE 3

| Absorber | UVA type | loss rate (A/MJ/m$^2$ exposure)* |
|---|---|---|
| Cyasorb ® 531 | benzophenone | 0.18 |
| Uvinul ® 3039 | cyanoacrylate | 0.14 |
| Cyasorb ® 5411 | benzotriazole | 0.11 |
| Tinuvin ® 360 | benzotriazole | 0.15 |
| Cyasorb ® 1164 | triazine | 0.085 |
| Tinuvin ® 1577 | triazine | 0.02 |
| Adeka LA-46 | triazine | 0.02 |
| 4,6-dibenzoylresorcinol (DBR) | benzophenone | 0.03 |

*A/MJ/m$^2$ exposure = absorption units at 330 nm per megajoule per meter squared.

Example 4

Coating Solutions with Benzotriazole UV Absorbers

A coating solution was prepared containing 7 grams (g) of Elvacite 2041 PMMA, 79 g of 1-methoxy-2-propanol, 14 g of diacetone alcohol, 0.85 g of Tinuvin 384, 0.43 g of Tinuvin 328, 0.22 g of Cyasorb 5411, and 2 drops of BYK 331 surfactant. Thus, the solution contains 7% PMMA by total weight and 10% Tinuvin 384, 5% Tinuvin 328, and 2.5% Cyasorb 5411 based on solids. This solution was applied by flow coating onto 7 mil (177.8 μm) polycarbonate films 10 inches (25.4 cm) wide and 15 inches (38.1 cm) long, the solvent was flashed at 50° C. for 10 minutes, and the coated film was baked for 1 hour at 100° C. The top 5 inches (12.7 cm) of the films was discarded.

Example 5

Coating Solutions with Dibenzoylresorcinol and Diphenyltriazine UV Absorbers

A coating solution was prepared containing 14 g of Elvacite 2041 PMMA, 158 g of 1-methoxy-2-propanol, 28 g of diacetone alcohol, 1.7 g of 4,6-dibenzoylresorcinol (DBR), 0.85 g of Adeka LA-46, 0.43 g of Tinuvin 1577, and four drops of BYK 331 surfactant. Thus, the solution contains 7% PMMA by total weight and 10% DBR, 5% LA-46, and 2.5% of Tinuvin 1577 based on solids. This solution was applied by flow coating onto 7 mil (177.8 μm) polycarbonate films 10 inches (25.4 cm) wide and 15 inches (38.1 cm) long, the solvent was flashed at 50° C. for 10 minutes, and the coated film was baked for 1 hour at 100° C. The top 5 inches (12.7 cm) of the films was discarded.

Example 6

Weathering of Encapsulated Cells

Packaging of CIGS solar cells (Global Solar Energy, Tuscon, Ariz.) consists of the following laminate stack-up: backsheet/encapsulant/solar cell/encapsulant/top-sheet. The laminate structure is placed in a small vacuum laminator set to 150° C. The stack-up is placed in the laminator under vacuum for five minutes. During this de-gassing step, parts reach approximately 90° C. After five minutes, pressure is applied to the laminate and the part is held at temperature for eleven minutes. Following the lamination step, the part is removed and lamination is complete.

Weathering conditions: Samples were weathered in an Atlas Ci5000 xenon arc Weather-ometer* using a Rightlight* inner filter and a CIRA quartz outer filter on the lamp with a cycle of 160 minutes light and 20 minutes light with water spray. The settings during the light period were irradiance 0.80 W/m²/nm at 340 nm, 65° C. black panel, 45° C. chamber air, and 50% relative humidity. During the water spray, the settings were irradiance 0.80 W/m²/nm at 340 nm, 35° C. black panel, 25° C. chamber air, and 100% relative humidity. Exposure was measured as MJ/m²/nm at 340 nm. The samples were mounted on holders offset 6 inches (15.2 cm) toward the lamp making the irradiance incident on the samples 1.9× the measured amount and increasing the black panel temperature to 75° C.

Figure 3:
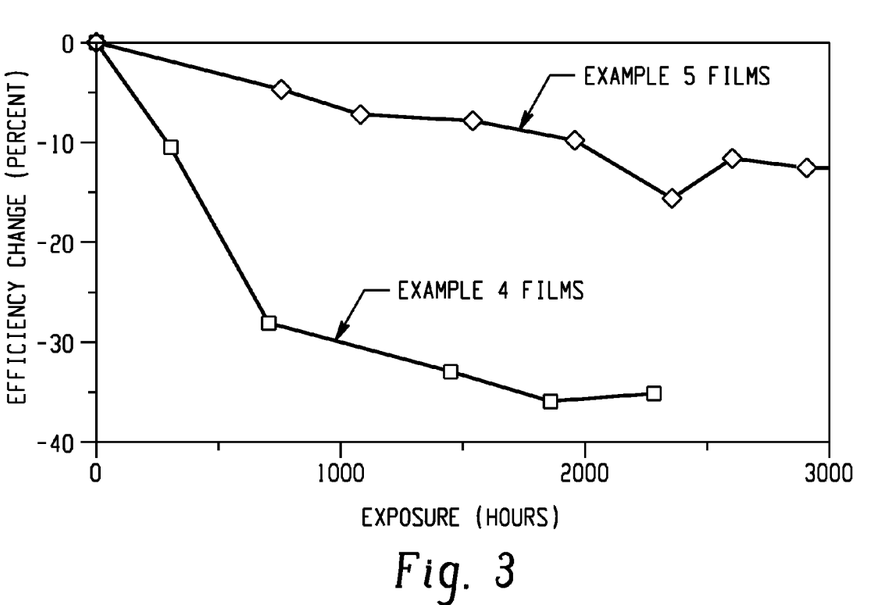
FIG. 3 is a graphical representation of efficiency change (%) versus exposure (hr).

Encapsulated CIGS cells were exposed in triplicate and removed periodically for efficiency measurements. After 4,253 hours of weathering exposure, the cells encapsulated using the benzotriazole coatings of Example 4 were rough and pitted and exhibited a decrease in efficiency of 65% relative to their initial efficiency of 12.2%. By contrast, after 4,837 hours of exposure the cells encapsulated using the coating containing more stable UV absorbers of Example 5 appeared unchanged and showed a decrease in efficiency of only 16.2% relative to their initial efficiency of 11.7%. A graph of the results is shown in FIG. 3. This shows that the particular UV absorber is important for long-term weathering performance and that the selection of UV absorber having long-term weatherability is not inherent and is not obvious.

Example 7

Co-Extruded PC Films

Co-extruded PC films comprising 8 mils (203 μm) of base resin and 4 mils (102 μm) of cap resin were prepared with the compositions of the cap resins shown in Table 4. These films were painted black on the back sides, partially masked with removable black aluminum strip, and subjected to weathering under the conditions described in Example 5. The samples were removed periodically, the mask was removed, and the amount of erosion was determined using a Dektak II stylus profilometer. The erosion rates are shown in Table 4. Tinuvin 360 is a high molecular weight benzotriazole used in co-extruded products. The 4,6-diphenyltriazines clearly give superior performance. In this test, one year of Florida weathering is simulated by approx. 3 megajoules/m² (MJ/m²) of xenon arc exposure measured at 340 nm. At 8 parts per hundred resin by weight (pph) loading or greater of Tinuvin 1577 or 10 pph or greater of LA-46, we expect about 3 micrometers per year (μm/yr) of erosion so that a 4 mil (102 μm) cap layer would be expected to weather for greater than 25 years. By contrast, cap layer employing the benzotriazole UV absorber (run 2) will be exhausted after 17 years.

TABLE 4

Erosion rates for co-extruded films during xenon arc exposure

| run # | cap resin composition | UVA type | Erosion rate (microns/MJ/m²) |
|---|---|---|---|
| 1 | Control (no UVA) | — | 6.1 |
| 2 | Tinuvin 360 7 pph | benzotriazole | 2.2 |
| 3 | Tinuvin 1577 4 pph | diphenyltriazine | 2.4 |
| 4 | Tinuvin 1577 6 pph | diphenyltriazine | 1.7 |
| 5 | Tinuvin 1577 8 pph | diphenyltriazine | 1.3 |
| 6 | LA-46 6 pph | diphenyltriazine | 2.1 |
| 7 | LA-46 8 pph | diphenyltriazine | 1.6 |
| 8 | LA-46 10 pph | diphenyltriazine | 1.1 |

A second method of protection is use of a co-extruded cap layer of a polymer containing a relatively high loading of UV absorber. Co-extrusion of a thin layer of highly stabilized PC and a thicker PC substrate is well-established technology. Current commercial products use benzotriazole or cyanoacrylate-type UV absorbers in 5-10% loading in a 2 to 5 mil (50.8 to 127 μm) cap layer. These absorbers are not very photostable and result in fairly fast erosion, yellowing, and loss of transmission over the course of 7 to 10 years outdoors. Diphenyltriazine-type UV absorbers are commercial products that are much more stable and have been marketed for use in co-extrusion, usually with the idea that lower concentrations can be used to achieve performance similar to more conventional absorbers. These absorbers are characterized as having a loss rate of less than 0.05 absorbance units per megajoule per meter squared (A/MJ/m²) of xenon arc exposure as compared to greater than 0.1 A/MJ/m² for the more conventional absorbers.

A third method of improving weathering is use of a highly weatherable, UV blocking polymer, e.g., resorcinol polyarylate (RPA, also known as ITR or Lexan SLX™) When exposed to sunlight, the RPA undergoes a rearrangement to a 2-hydroxybenzophenone that acts as a UV absorber. This is not stable indefinitely and the material erodes at a rate of less than or equal to 3 μm/yr. The RPA can be a block copolymer of RPA and PC. Desirably, the RPA content of the block copolymer can be 50 wt % to 95 wt %, specifically, 80 wt % to 90 wt %.

It is noted that the RPA-PC copolymer can be co-extruded with PC to make a film or sheet. Layers can have a thickness of 3 to 10 mils (76.2 to 254 μm) of RPA-PC and 5 to 20 mils (127 μm to 508 μm) of PC. Most particularly is 4 to 5 mils (101.6 μm to 127 μm) of RPA-PC and 5 μm to 15 mils (127 μm to 381 μm) of PC.

In various embodiments, RPA-PC can be laminated onto PET using an adhesive such as thermoplastic polyurethane or during an extrusion process.

Example 8

Weathering of RPA Laminates

A 5 mil (127 μm) thick extruded film of 90:10 RPA:PC (based on weight) block copolymer was vacuum laminated onto Melinex 725 PET film (from DuPont-Teijin) using an approximately 7 mil (177.8 μm) thick thermoplastic polyurethane film (from Bayer) as the adhesive. The back of the sample was painted black. The samples were subjected to accelerated weathering using the conditions in Example 6. After 49 megaJoules per square meter (MJ/m²) of exposure (measured at 340 nm), the films were fully transparent and ductile when folded. Non-laminated films became yellowed and brittle after 4 MJ/m² of exposure (measured at 340 nm). Resorcinol polyarylates have been reported to have erosion rates less than or equal to 3 μm/year as estimated from filtered xenon arc weathering in Polymer Preprints 48(1), 643-644, (2007).

Example 9

Moisture Barriers

Five-zone graded barrier coatings were applied using methods described in U.S. Pat. No. 7,015,640, to the backs of polymer that had the coatings described in Example 5 applied to the front sides.

The graded-composition coating having a thickness of about 500 nm was formed using the radio-frequency plasma-enhanced chemical vapor deposition (RFPECVD) technique.

Silane (maximum flow rate of about 500 standard cm³/minute), ammonia (maximum flow rate of about 60 standard cm³/minute), and organic precursor (maximum flow rate of about 500 standard cm³/minute) were used to produce the graded coating comprising silicon, carbon, oxygen, and nitrogen. The rates of the reactant gases were varied during deposition so that the composition of the coating varied continuously across its thickness. The power fed to the RF electrode was about 100 watts (W) when plasma was generated from the organic precursor, and about 200 W when a mixture of silane and ammonia was fed into the reactor. The vacuum level in the reactor was about 0.2 mm Hg and the average temperature was about 55° C.

These coated films were used to vacuum encapsulate CIGS photovoltaic cells (Global Solar Energy, Tuscon, Ariz.) using 0.5 inches (1.27 cm) Truseal edge tapes (Truseal Technologies, Solon, Ohio), thermoplastic polyurethane encapsulant and glass on the back side. Triplicate cells were then subjected to damp heat testing at 85° C. and 85% relative humidity. Compositions and results are shown in Table 5. The HP-H leveling layer is an abrasion resistant UV-cured coated film from SABIC Innovative Plastics. Excellent retention of cell efficiency was obtained when a graded barrier was applied to the UV-protected polymer films. The cells of Run 3 were subsequently placed under the accelerated weathering conditions described in Example 6. After 4,115 hours of exposure, one cell failed by delamination, but the other two cells had retained 88% of their initial efficiency, losing only 3% during weathering. This example shows that effective moisture barriers can be applied to UV-protected PC and PET films.

TABLE 5

Table 5. Efficiency retention after 1010 hours damp heat testing. Average of three cells.

| Run # | base film | leveling layer | barrier | % of initial efficiency |
|---|---|---|---|---|
| 1 | 7 mil (177.8 µm) PC | none | none | 23 |
| 2 | 7 mil (177.8 µm) PC | none | 5-zone | 97.3 |
| 3 | 15 mil (381 µm) PC | HP-H | 5-zone | 90.6 |
| 4 | 7 mil (177.8 µm) Melinex 725 PET | none | 5-zone | 95.4 |

Example 10

Encapsulation Using Co-Extruded PC

Polycrystalline silicon photovoltaic cells were vacuum encapsulated using co-extruded films of runs 5 and 8 of Example 7 on the front, EVA encapsulant, and ⅛ inch (0.32 centimeters (cm)) thick BPA polycarbonate sheet on the back. These cells are being subjected to accelerated weathering using the conditions described in Example 6.

Seven of these cells, having an average initial efficiency of 14.3%, were subjected to accelerated weathering conditions of Example 6. After 17.5 MJ/m² at 340 nm exposure (3,200 hours; equivalent to 5.8 years of Florida weathering), the cells had an average efficiency of 13.6%, indicating a relative loss of 4.9% efficiency. Exclusion of one poor cell gave an average efficiency of 13.8% for the other six, indicating a relative loss of 3.5% efficiency. Both are within the 1% loss per year generally considered tolerable.

Previously, optoelectronic devices needed to be formed of glass in order to meet the warranty requirements. Intrinsically highly weatherable polymers such as ETFE can be used for glazing, but the inherently expensive polymers must be used as very thin films (less than 5 mils or less than 127 µm) to avoid prohibitively high cost. This makes the module subject to mechanical damage such as cuts and punctures that allow liquid water to penetrate and degrade the device. Engineering polymers such as BPA polycarbonate and poly(ethylene terephthalate) are a fraction of the cost of fluorinated polymers. The present design, a result of careful and non-obvious choices of weathering protection methods, allows the use of thicker (greater than or equal to 5 mils or greater than or equal to 127 µm) films of less expensive and mechanically tougher polymers then fluorinated polymers while meeting extreme weatherabilty requirements and at similar or lower cost.

An optoelectronic device assembly can comprise: a coated element and an electroactive cell on the coated element, wherein the electroactive cell is selected from the group consisting of a light emitting diode and a photovoltaic cell. The coated element can comprise: transparent thermoplastic substrate and a protective weathering layer. The transparent thermoplastic substrate can comprise a material selected from the group consisting of aromatic polycarbonate and polyester, and combinations comprising at least one of the foregoing materials. The protective weathering layer can have a UV absorbance loss rate at 330 nm of less than or equal to 0.15 A/year as estimated from filtered xenon arc exposure and/or having a rate of erosion of less than or equal to 5 µm per year as estimated from filtered xenon arc exposure.

Optionally, an optoelectronic device assembly can comprise a coated element, an optoelectronic device on the coated element, and an encapsulant located between the optoelectronic device and the substrate. The optoelectronic device can be selected from the group consisting of a light emitting diode and a photovoltaic cell. The coated element can comprise a transparent thermoplastic substrate, a protective weathering layer, and a primer located between the weathering layer and the substrate. The transparent thermoplastic substrate can comprise a material selected from the group consisting of aromatic polycarbonate and polyester, and combinations comprising at least one of the foregoing materials. The a protective weathering layer can have UV absorbance loss rate at 330 nm of less than or equal to 0.15 A/year as estimated from filtered xenon arc exposure and/or having a rate of erosion of less than or equal to 5 µm per year as estimated from filtered xenon arc exposure.

In the various embodiments, (i) the protective weathering layer can comprise a UV absorbers selected from the group consisting of 4,6-dibenzoylresorcinol, silylated 4,6-dibenzoylresorcinols, 2,4-diphenyl-6-(2'-hydroxy-4'alkoxyphenyl)-1,3,5-triazines, and combinations comprising at least one of the foregoing; and/or (ii) the protective weathering layer can further comprise a matrix selected from the group consisting of silicone, poly(meth)acrylates, and combinations comprising at least one of the foregoing; and/or (iii) the protective weathering layer can comprise resorcinol polyarylate; and/or (iv) the device can further comprise a barrier coating layer comprising at least one zone substantially organic in composition and at least one zone substantially inorganic in composition; and/or (v) the device can further comprise a UV-cured acrylic-colloidal silica coating layer; and/or (vi) the device can further comprise a planarizing layer selected from the group consisting of an epoxy based resin, an acrylic based resin, a silicone resin, and a combination comprising at least one of the foregoing; and/or (vii) the planarizing layer can have a thickness of 1 nm to 100 µm; and/or (viii) the protective weathering layer can comprise triazine of the formula:

wherein $R_1$=H, $R_2$, $R_3$=independently H, aliphatic $C_1$-$C_{12}$, cycloaliphatic $C_3$-$C_{12}$, or aromatic, $R_4$=H, $C_1$-$C_{24}$ aliphatic, or $C_3$-$C_{24}$ cycloaliphatic; and/or (ix) $R_1$, $R_2$, and $R_3$ can equal H; and/or (x) $R_4$ can be $C_6H_{13}$; and/or (xi) $R_4$ can be $CH_2CH_2OOCC_7H_{15}$; and/or (xi) the protective weathering layer can comprise dibenzoylresorcinol of the formula:

wherein $R_5$=H, aliphatic $C_1$-$C_{12}$, cycloaliphatic $C_3$-$C_{12}$, $CH_2CH_2CH_2SiR_n(OR_8)_{3-n}$, n=0-2, $R_8$=H, aliphatic $C_1$-$C_{12}$; and $R_6$, $R_7$=independently H, aliphatic $C_1$-$C_{12}$, cycloaliphatic $C_3$-$C_{12}$, or aromatic; and/or (xii) $R_5$, $R_6$, and $R_7$ can be H; and/or (xiii) the protective weathering layer can comprise dibenzoylresorcinol of the formula:

wherein $R_9$, $R_{10}$, $R_{11}$, $R_{12}$ are independently H, aliphatic $C_1$-$C_{12}$, cycloaliphatic $C_3$-$C_{12}$, or aromatic.

All ranges disclosed herein are inclusive of the endpoints, and the endpoints are independently combinable with each other (e.g., ranges of "up to 25 wt. %, or, more specifically, 5 wt. % to 20 wt. %", is inclusive of the endpoints and all intermediate values of the ranges of "5 wt. % to 25 wt. %," etc.). "Combination" is inclusive of blends, mixtures, alloys, reaction products, and the like. Furthermore, the terms "first," "second," and the like, herein do not denote any order, quantity, or importance, but rather are used to d one element from another. The terms "a" and "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the film(s) includes one or more films). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

All cited patents, patent applications, and other references are incorporated herein by reference in their entirety. However, if a term in the present application contradicts or conflicts with a term in the incorporated reference, the term from the present application takes precedence over the conflicting term from the incorporated reference While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. An optoelectronic device assembly comprising:
   a coated element comprising
      transparent thermoplastic substrate comprising a material selected from the group consisting of aromatic polycarbonate and polyester, and combinations comprising at least one of the foregoing materials, and
      a protective weathering layer having UV absorbance loss rate at 330 nm of less than or equal to 0.15 A/year as estimated from filtered xenon arc exposure and/or having a rate of erosion of less than or equal to 5 μm per year as estimated from filtered xenon arc exposure; and
   an optoelectronic device on the coated element, wherein the optoelectronic device is selected from the group consisting of a light emitting diode and a photovoltaic cell.

2. The assembly of claim 1, wherein the protective weathering layer comprises a UV absorbers selected from the group consisting of 4,6-dibenzoylresorcinol, silylated 4,6-dibenzoylresorcinols, 2,4-diphenyl-6-(2'-hydroxy-4' alkoxyphenyl)-1,3,5-triazines, and combinations comprising at least one of the foregoing.

3. The assembly of claim 2, wherein the protective weathering layer further comprises a matrix selected from the group consisting of silicone, poly(meth)acrylates, and combinations comprising at least one of the foregoing.

4. The assembly of claim 1, wherein the protective weathering layer comprises resorcinol polyarylate.

5. The assembly of claim 1, further comprising a barrier coating layer comprising at least one zone substantially organic in composition and at least one zone substantially inorganic in composition.

6. The assembly of claim 1, further comprising a UV-cured acrylic-colloidal silica coating layer.

7. The assembly of claim 1, further comprising a planarizing layer selected from the group consisting of an epoxy based resin, an acrylic based resin, a silicone resin, and a combination comprising at least one of the foregoing.

8. The assembly of claim 7, wherein the planarizing layer has a thickness of 1 nm to 100 μm.

9. The assembly of claim 1, wherein the protective weathering layer comprises triazine of the formula:

wherein $R_1$=H, $R_2$, $R_3$=independently H, aliphatic $C_1$-$C_{12}$, cycloaliphatic $C_3$-$C_{12}$, or aromatic, $R_4$=H, $C_1$-$C_{24}$ aliphatic, or $C_3$-$C_{24}$ cycloaliphatic.

10. The assembly of claim 9, wherein $R_1$, $R_2$, and $R_3$=H.

11. The assembly of claim 10, wherein $R_4$=$C_6H_{13}$.

12. The assembly of claim 10, wherein $R_4$=$CH_2CH_2OOCC_7H_{15}$.

13. The assembly of claim 1, wherein the protective weathering layer comprises dibenzoylresorcinol of the formula:

wherein $R_5$=H, aliphatic $C_1$-$C_{12}$, cycloaliphatic $C_3$-$C_{12}$, $CH_2CH_2CH_2SiR_n(OR_8)_{3-n}$, n=0-2, $R_8$=H, aliphatic $C_1$-$C_{12}$; and $R_6$, $R_7$=independently H, aliphatic $C_1$-$C_{12}$, cycloaliphatic $C_3$-$C_{12}$, or aromatic.

14. The assembly of claim 13, wherein $R_5$, $R_6$, and $R_7$=H.

15. The assembly of claim 1, wherein the protective weathering layer comprises dibenzoylresorcinol of the formula:

wherein $R_9$, $R_{10}$, $R_{11}$, $R_{12}$ are independently H, aliphatic $C_1$-$C_{12}$, cycloaliphatic $C_3$-$C_{12}$, or aromatic.

16. An optoelectronic device assembly comprising:
a coated element, comprising
transparent thermoplastic substrate comprising a material selected from the group consisting of aromatic polycarbonate and polyester, and combinations comprising at least one of the foregoing materials,
a protective weathering layer having UV absorbance loss rate at 330 nm of less than or equal to 0.15 A/year as estimated from filtered xenon arc exposure and/or having a rate of erosion of less than or equal to 5 μm per year as estimated from filtered xenon arc exposure; and
a primer located between the weathering layer and the substrate;
an optoelectronic device on the coated element, wherein the optoelectronic device is selected from the group consisting of a light emitting diode and a photovoltaic cell; and
an adhesive located between the optoelectronic device and the substrate.

17. An optoelectronic device assembly comprising:
a coated element comprising
transparent thermoplastic substrate comprising a material selected from the group consisting of aromatic polycarbonate and polyester, and combinations comprising at least one of the foregoing materials, and
a protective weathering layer comprising a block copolymer comprising resorcinol polyarylate and polycarbonate, and wherein the block copolymer has a resorcinol polyarylate block content of greater than or equal to 80 wt % and without an additional UV absorber; and
an optoelectronic device on the coated element, wherein the optoelectronic device is selected from the group consisting of a light emitting diode and a photovoltaic cell.

18. An optoelectronic device assembly comprising:
a coated element comprising
transparent thermoplastic substrate comprising a material selected from the group consisting of aromatic polycarbonate and polyester, and combinations comprising at least one of the foregoing materials, and
a protective weathering layer comprising polycarbonate and greater than or equal to 7 wt % UV absorber; and
an optoelectronic device on the coated element, wherein the optoelectronic device is selected from the group consisting of a light emitting diode and a photovoltaic cell.

19. The assembly of claim 18, wherein the UV absorber comprises triazine.

20. The assembly of claim 19, wherein the UV absorber comprises diphenyltriazine.

21. The assembly of claim 19, wherein the protective weathering layer comprises triazine of the formula:

wherein $R_1$=H, $R_2$, $R_3$=independently H, aliphatic $C_1$-$C_{12}$, cycloaliphatic $C_3$-$C_{12}$, or aromatic, $R_4$=H, $C_1$-$C_{24}$ aliphatic, or $C_3$-$C_{24}$ cycloaliphatic.

22. The assembly of claim 21, wherein $R_1$, $R_2$, and $R_3$=H.

23. The assembly of claim 22, wherein $R_4$=$C_6H_{13}$.

24. The assembly of claim 22, wherein $R_4$=$CH_2CH_2OOCC_7H_{15}$.

25. The assembly of claim 4, wherein the protective weathering layer comprises a block copolymer comprising polycarbonate and the resorcinol polyarylate.

* * * * *